(12) United States Patent
Cheng et al.

(10) Patent No.: US 11,798,969 B2
(45) Date of Patent: *Oct. 24, 2023

(54) APPARATUS AND METHODS FOR SENSING LONG WAVELENGTH LIGHT

(71) Applicant: Taiwan Semiconductor Manufacturing Co., Ltd., Hsin-Chu (TW)

(72) Inventors: Yun-Wei Cheng, Taipei (TW); Chun-Hao Chou, Tainan (TW); Kuo-Cheng Lee, Tainan (TW); Ying-Hao Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/841,546

(22) Filed: Jun. 15, 2022

(65) Prior Publication Data

US 2022/0310677 A1    Sep. 29, 2022

Related U.S. Application Data

(63) Continuation of application No. 16/998,498, filed on Aug. 20, 2020, now Pat. No. 11,367,745.

(51) Int. Cl.
*H01L 27/146* (2006.01)
*H01L 31/0216* (2014.01)
*H01L 31/028* (2006.01)

(52) U.S. Cl.
CPC ........ *H01L 27/1463* (2013.01); *H01L 31/028* (2013.01); *H01L 31/02161* (2013.01)

(58) Field of Classification Search
CPC .......... H01L 27/1463; H01L 31/02161; H01L 31/028
See application file for complete search history.

(56) References Cited

U.S. PATENT DOCUMENTS

| | | |
|---|---|---|
| 2007/0120214 A1 | 5/2007 | Cole |
| 2012/0083066 A1* | 4/2012 | Kim .................. H01L 27/14643 438/73 |
| 2014/0015026 A1* | 1/2014 | Ahn .................. H01L 27/14605 257/292 |
| 2015/0325591 A1* | 11/2015 | Guo .................... G02F 1/13394 438/158 |
| 2017/0141153 A1 | 5/2017 | Lee |
| 2018/0233528 A1* | 8/2018 | Na ...................... H01L 31/0376 |

(Continued)

FOREIGN PATENT DOCUMENTS

| | | |
|---|---|---|
| TW | I568021 B | 1/2017 |
| TW | I576990 B | 4/2017 |

(Continued)

*Primary Examiner* — Sitaramarao S Yechuri
(74) *Attorney, Agent, or Firm* — Duane Morris LLP

(57) ABSTRACT

Apparatus and methods for sensing long wavelength light are described herein. A semiconductor device includes: a carrier; a device layer on the carrier; a semiconductor layer on the device layer, and an insulation layer on the semiconductor layer. The semiconductor layer includes isolation regions and pixel regions. The isolation regions are or include a first semiconductor material. The pixel regions are or include a second semiconductor material that is different from the first semiconductor material.

20 Claims, 20 Drawing Sheets

(56) References Cited

U.S. PATENT DOCUMENTS

| | | |
|---|---|---|
| 2018/0331159 A1 | 11/2018 | Lee |
| 2019/0288026 A1 | 9/2019 | Von Kaenel |
| 2019/0305093 A1 | 10/2019 | Delacruz |
| 2021/0366976 A1* | 11/2021 | Chen ................ H01L 27/14647 |

FOREIGN PATENT DOCUMENTS

| | | |
|---|---|---|
| TW | I596676 B | 8/2017 |
| TW | I670840 B | 9/2019 |
| TW | I692076 B | 4/2020 |
| TW | 202023041 A | 6/2020 |

\* cited by examiner

APPARATUS AND METHODS FOR SENSING LONG WAVELENGTH LIGHT

CROSS-REFERENCE TO RELATED APPLICATION

The present application is a continuation of U.S. patent application Ser. No. 16/998,498, filed on Aug. 20, 2020, which is incorporated by reference herein in its entirety.

BACKGROUND

Semiconductor image sensors typically include complementary metal-oxide-semiconductor (CMOS) image sensors (CIS) and charge-coupled device (CCD) sensors, which are widely used to sense light in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the absorbed light into digital data or electrical signals.

A back side illuminated (BSI) CMOS image sensor is operable to detect light projected from their backside. The BSI CMOS image sensor technology is becoming a mainstream technology as it can significantly improve the image quality of the CMOS image sensors. However, a conventional BSI CMOS image sensor utilized epitaxial growth of silicon onto a semiconductor substrate. This requires a very thick light-sensing silicon layer due to poor light sensitivity of silicon, especially for long wavelength light.

As such, conventional BSI CMOS image sensors have not been entirely satisfactory in every aspect.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAIL DESCRIPTION

Figure 1:
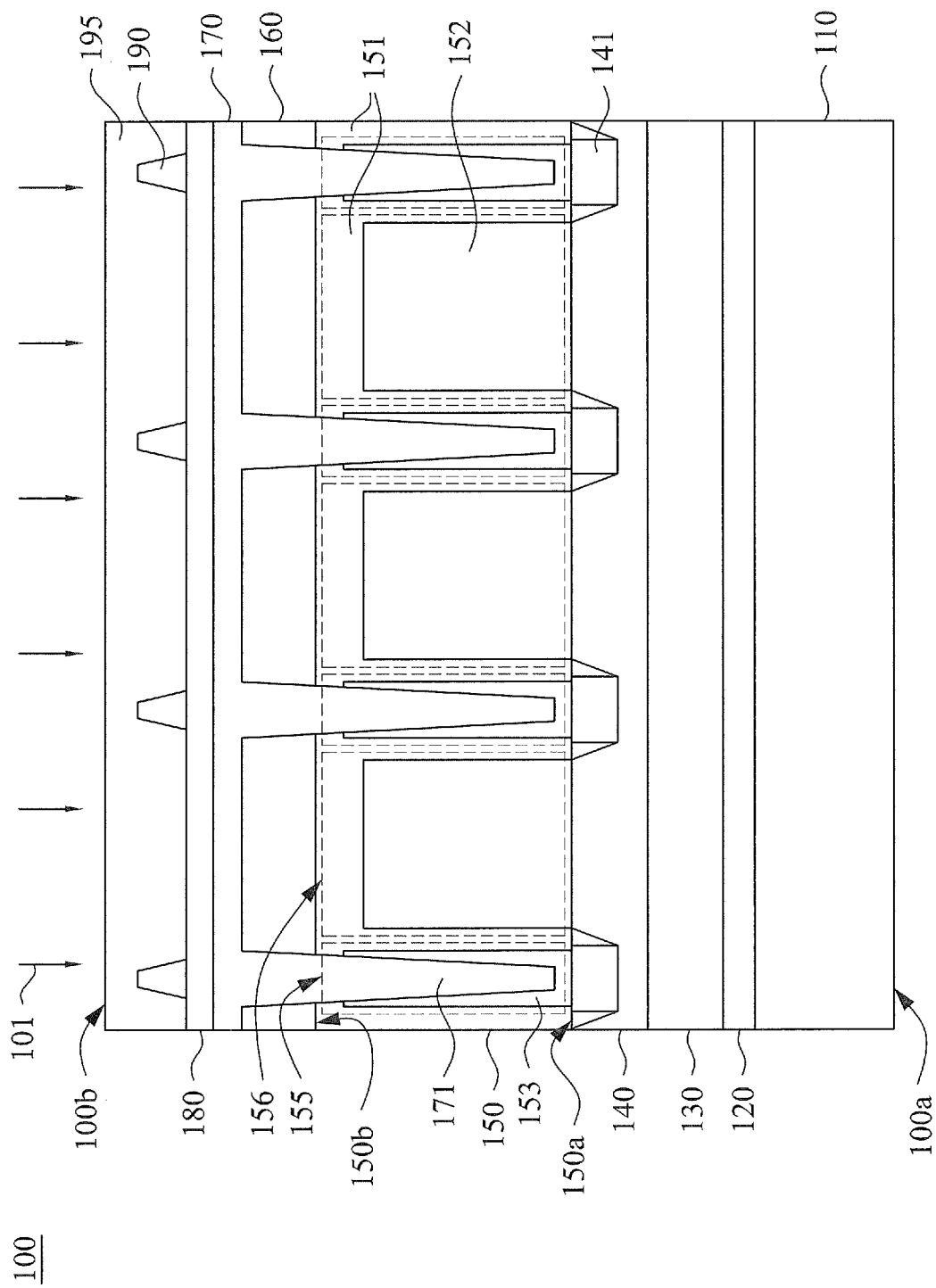
FIG. 1 illustrates a schematic cross-sectional view of a semiconductor device, in accordance with some embodiments of the present disclosure.

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

The present disclosure provides devices and methods for sensing light with long wavelengths. A disclosed back side illuminated (BSI) CMOS image sensor may include multiple semiconductor materials formed based on a silicon on insulator (SOI) structure to passivate BSI silicon surface.

In one embodiment, a disclosed image sensor structure can increase photon-electron transform efficiency and thus quantum efficiency of the device by replacing part of silicon in the light sensing regions with germanium or another semiconductor material with a higher absorption coefficient than silicon or a smaller band gap than silicon. Each light sensing region corresponds to a pixel of the image sensor and can be doped with selective doping concentrations. That is, doping concentration may vary from pixel to pixel based on a design of the image sensor for an optimized result. In addition, the image sensor is formed based on an SOI structure to reduce silicon damage during backside structure forming. The SOI structure can provide better passivation of the epitaxial grown materials in BSI fabrication processes.

In one embodiment, separated substrate material, e.g. silicon and germanium, are used for logic device and optical sensing area respectively, for both to achieve optimized performance. Fabricating a logic device, e.g. a MOS device, on silicon with a corresponding well embedded therein, does not need device re-calibration for an integrated circuit.

In various embodiments, the disclosed image sensor may utilize a patterned surface structure, e.g. a non-flat and periodic surface structure, to improve light absorption and quantum efficiency; utilize a backside deep trench isolation (BDTI) structure to reduce optical crosstalk; and/or utilize an implantation well isolation structure to reduce electrical crosstalk within the image sensor.

FIG. 1 illustrates a schematic cross-sectional view of a semiconductor device 100, in accordance with some embodiments of the present disclosure. In some embodiments, the semiconductor device 100 is a CMOS image sensor device, which may be operated for sensing incident light 101. The semiconductor device 100 has a front side 100a and a back side 100b. In some embodiments, the semiconductor device 100 is a BSI CMOS image sensor device, which is operated to sense the incident light 101 from its back side 100b.

As shown in FIG. 1, the semiconductor device 100 includes a carrier 110, a device layer 140, and a semiconductor layer 150. When the semiconductor device 100 is a general image sensor, in which light-sensing pixels and logic devices are formed in the same wafer, the carrier 110 is a support base of the wafer for a flip chip process and/or a thinning process. When the semiconductor device 100 is a stacking image sensor, in which light-sensing pixels and logic devices are respectively formed on different wafers, the carrier 110 is a logic wafer on which the logic devices are formed.

The device layer 140 is disposed over the carrier 110. The device layer 140 includes various devices 141, such as transistors or other MOS devices. In some exemplary examples, the semiconductor device 100 optionally includes a passivation layer 120 disposed on the carrier 110. The passivation layer 120 may be suitable for bonding the device layer 140 to the carrier 110. The passivation layer 120 may be a dielectric film, such as silicon oxide, silicon nitride, silicon oxynitride, silicon carbide, or any combinations thereof. Optionally, the semiconductor device 100 may include at least one inter-metal dielectric layer 130. The inter-metal dielectric layer 130 is disposed between the passivation layer 120 and the device layer 140. The inter-metal dielectric layer 130 includes conductive lines, which are electrically connected to the devices 141 of the device layer 140. The inter-metal dielectric layer 130 includes a dielectric film, such as silicon oxide, silicon nitride, silicon oxynitride, silicon carbide, or any combinations thereof.

In the example shown in FIG. 1, the semiconductor layer 150 is disposed on the device layer 140. The semiconductor layer 150 includes a plurality of isolation regions 155 and a plurality of pixel regions 156. In one embodiment, the plurality of pixel regions 156 are evenly distributed in the semiconductor layer 150 based on a predetermined design. In the example shown in FIG. 1, each of the plurality of isolation regions 155 is located between two adjacent pixel regions 156.

In the example shown in FIG. 1, the semiconductor layer 150 includes various light sensing regions 152. Each of the light sensing regions 152 is included in a corresponding one of the plurality of pixel regions 156. The light sensing regions 152 form a light sensing sublayer in the semiconductor layer 150. In one embodiment, the semiconductor layer 150 has a first thickness between 2 micrometers and 10 micrometers; and each of the plurality of light sensing regions 152 in the light sensing sublayer has a second thickness that is equal to or smaller than the first thickness.

As shown in FIG. 1, each of the plurality of pixel regions 156 comprises a light sensing region 152 and a semiconductor region 151 surrounding the light sensing region 152. In one embodiment, each semiconductor region 151 comprises a first semiconductor material, and each light sensing region 152 comprises a second semiconductor material that is different from the first semiconductor material. In one embodiment, the second semiconductor material has a band gap smaller than that of the first semiconductor material. Each of the first and second semiconductor materials may be a group IV material, a group IV material compound, or a group III-V material compound. In one example, the first semiconductor material is silicon, and the second semiconductor material is germanium or another semiconductor material or any semiconductor material compound having a band gap smaller than that of silicon.

Each of the light sensing regions 152 may include a photodiode. In one embodiment, each of the light sensing regions 152 may be a rectangular region. In one embodiment, each of the plurality of light sensing regions 152 is doped with a doping material. In one embodiment, doping concentrations of the plurality of light sensing regions 152 are different from each other based on a predetermined design.

In some examples, as shown in FIG. 1, the plurality of isolation regions 155 are disposed in the semiconductor layer 150 to define various pixel regions 156. In some exemplary examples, each of the plurality of isolation regions 155 is surrounded by the first semiconductor material in the semiconductor layer 150. In some exemplary examples, each of the plurality of isolation regions 155 comprises one of: a shallow trench isolation (STI), a deep trench isolation (DTI), or an implanted well. As shown in FIG. 1, each of the plurality of isolation regions 155 in this example includes an implanted well 153 to provide a well isolation between adjacent light sensing regions 152 to avoid electrical crosstalk. For example, when the light sensing regions 152 comprise n-type semiconductor material, the implanted well 153 may include p-type doping material to provide a p-type well isolation.

In one embodiment, each implanted well 153 comprises the first semiconductor material, e.g. silicon. As shown in FIG. 1, the plurality of devices 141 in the device layer 140 are located right under the isolation regions 155. That is, the plurality of devices 141 in the device layer 140 are in contact with the first semiconductor material in the implanted wells 153 and the semiconductor regions 151, but not in contact with the second semiconductor material in the light sensing regions 152. In one embodiment, the implanted wells 153 and the semiconductor regions 151 may be treated together as first semiconductor regions, e.g. silicon regions when the first semiconductor material is silicon.

The semiconductor layer 150 has a first surface 150a and a second surface 150b opposite to the first surface 150a, and the first surface 150a is adjacent to the device layer 140. In the example shown in FIG. 1, the second surface 150b is a flat surface. In another embodiment, the second surface 150b has a non-flat and periodic surface structure to provide a better light absorption and quantum efficiency of the semiconductor device 100.

In the example shown in FIG. 1, the semiconductor device 100 includes an insulation layer 160 on the semiconductor layer 150. The insulation layer 160 may be an insulator as part of an SOI structure used for forming the semiconductor device 100. In one embodiment, the insulation layer 160 comprises dielectric material, such as silicon oxide, silicon nitride, silicon oxynitride, silicon carbide, or any combinations thereof. In one embodiment, the insulation layer 160 serves as a passivation layer for the semiconductor layer 150.

As shown in FIG. 1, each of the plurality of isolation regions 155 in this example further includes a DTI structure 171 extending from a top surface of the insulation layer 160 to a predetermined depth of the semiconductor layer 150, so as to isolate two adjacent ones of the light sensing regions 152 to avoid optical crosstalk. This DTI structure 171 may be called a backside DI (BDTI). Each DTI structure 171 is filled with a dielectric material 170, such as silicon oxide, silicon nitride, silicon oxynitride, silicon carbide, or any combinations thereof. In certain examples, portions of the dielectric material 170 extend to cover the top surface of the insulation layer 160.

In some examples, as shown in FIG. 1, the semiconductor device 100 optionally includes a buffer layer 180. The buffer layer 180 overlies and covers the insulation layer 160 and the dielectric material 170 filling the DTI structures 171. The buffer layer 180 may be directly disposed on and contact the top surface of the insulation layer 160. In some exemplary examples, the top surface of the insulation layer 160 is covered by some portions of the dielectric material 170, and the buffer layer 180 is disposed on the dielectric material 170. The buffer layer 180 may be transparent and may include a dielectric material, such as silicon oxide, silicon nitride, silicon oxynitride, silicon carbide, or any combinations thereof.

As shown in FIG. 1, the semiconductor device 100 may optionally include a metal grid layer 190, in which the metal grid layer 190 is disposed on portions of the buffer layer 180. The metal grid layer 190 may block the incident light 101, and thus prevents the optical interference between the pixel regions 156. For example, the metal grid layer 190 may include W, Ti, TiN, Ta, TaN, Al, Cu, AlCu, Ni, or any combinations or alloys thereof.

As shown in FIG. 1, the semiconductor device 100 may optionally include a passivation layer 195. The passivation layer 195 is disposed on and covering the metal grid layer 190 and the buffer layer 180. The passivation layer 195 may be used to protect the metal grid layer 190 and the buffer layer 180. The passivation layer 195 may be a dielectric film, such as silicon oxide, silicon nitride, silicon oxynitride, silicon carbide, or any combinations thereof.

Figure 2A:
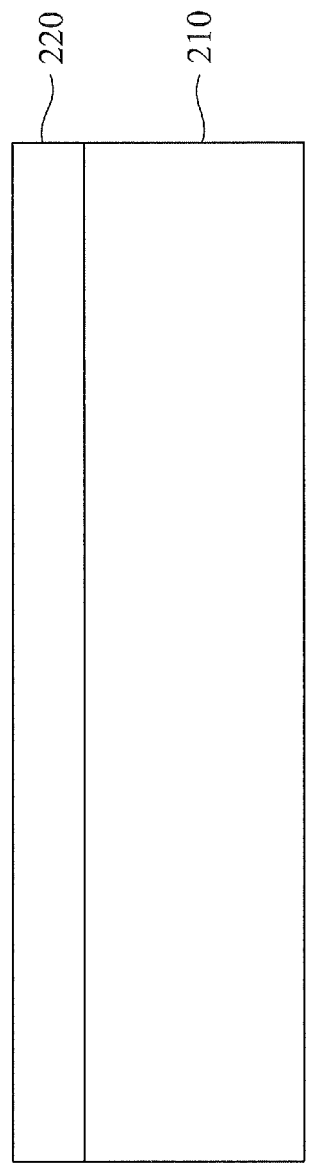
FIG. 2A through FIG. 2N are schematic cross-sectional views of intermediate stages showing a method for manufacturing a semiconductor device, in accordance with some embodiments of the present disclosure.
Figure 2B:
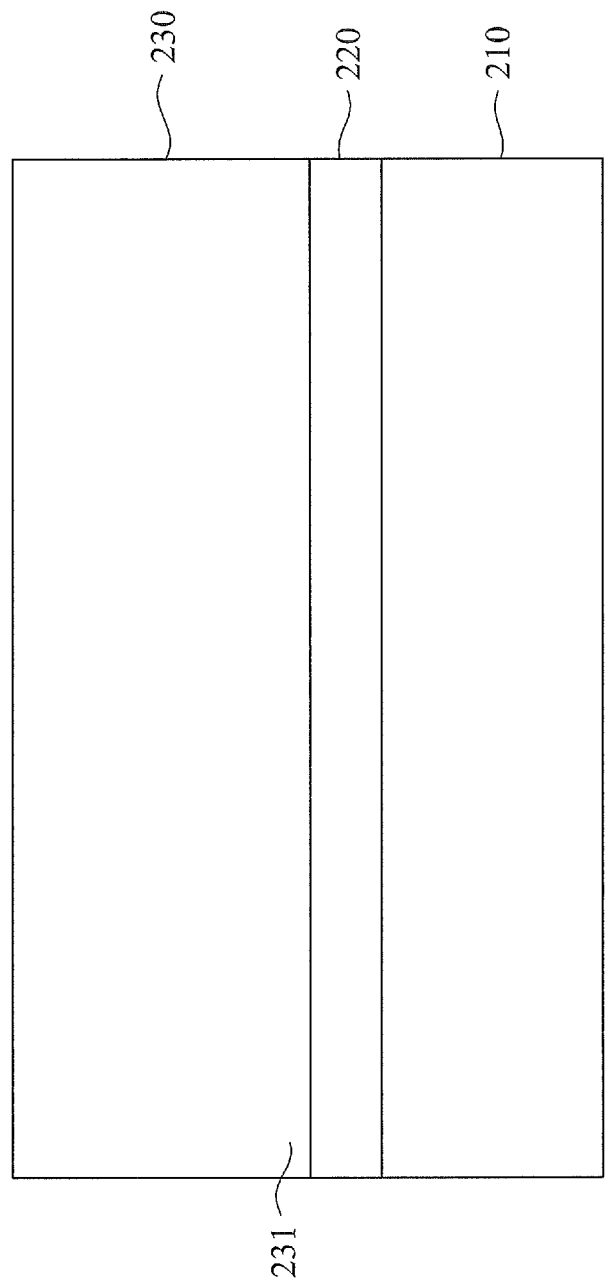
Figure 2C:
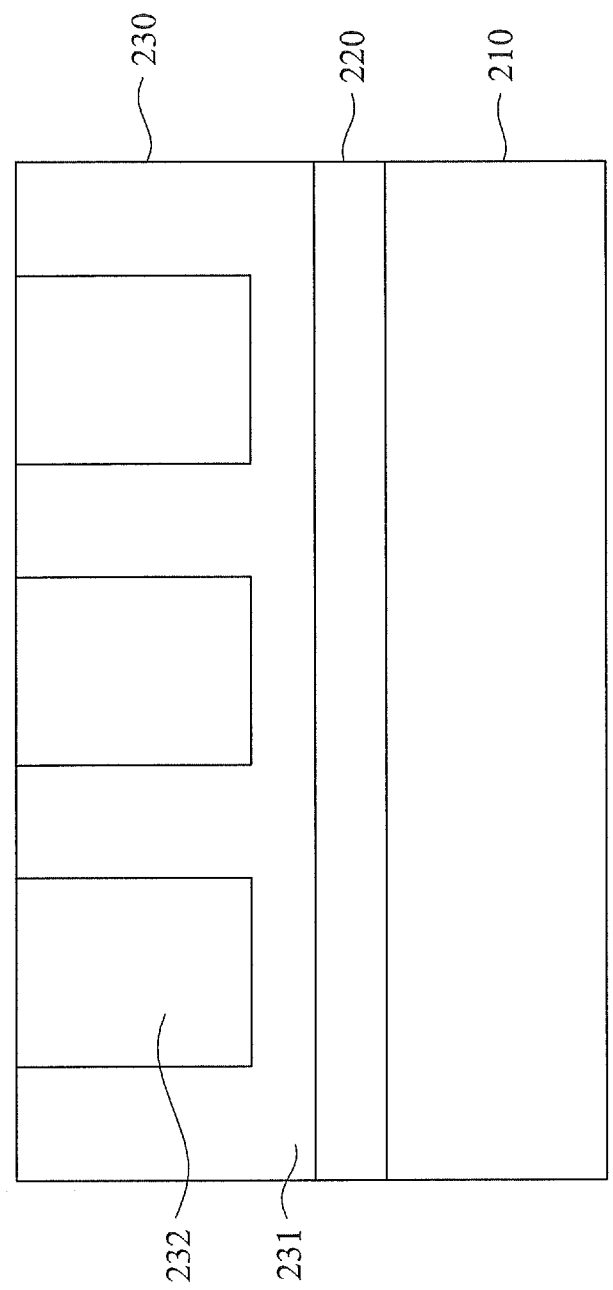
Figure 2D:
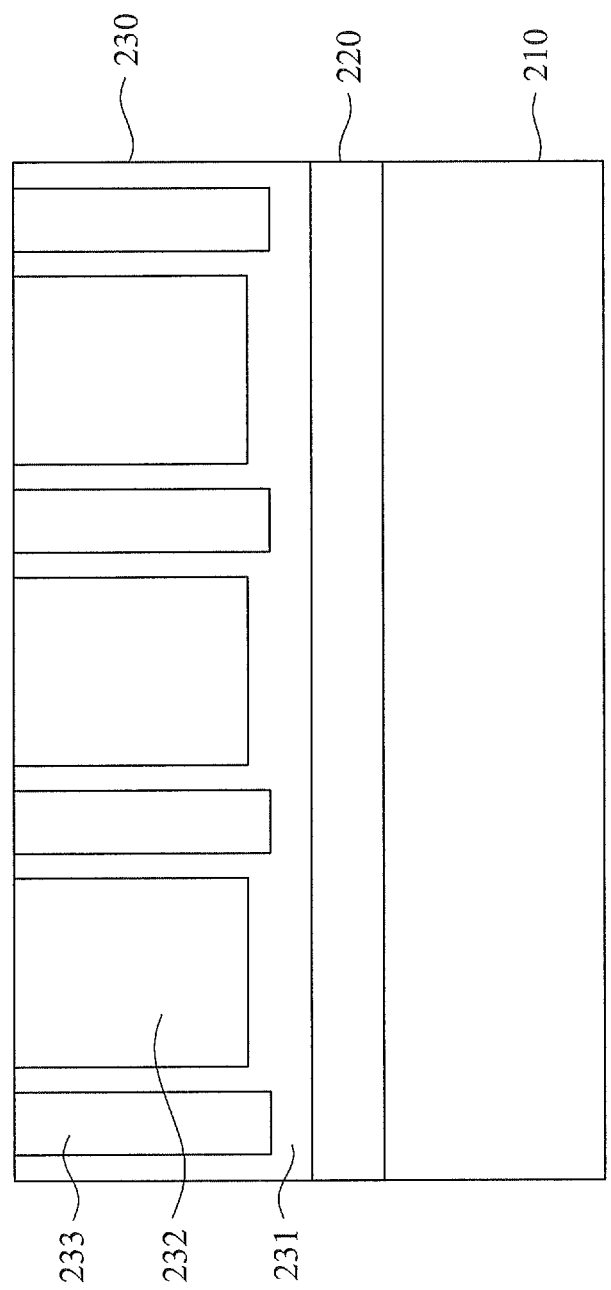
Figure 2E:
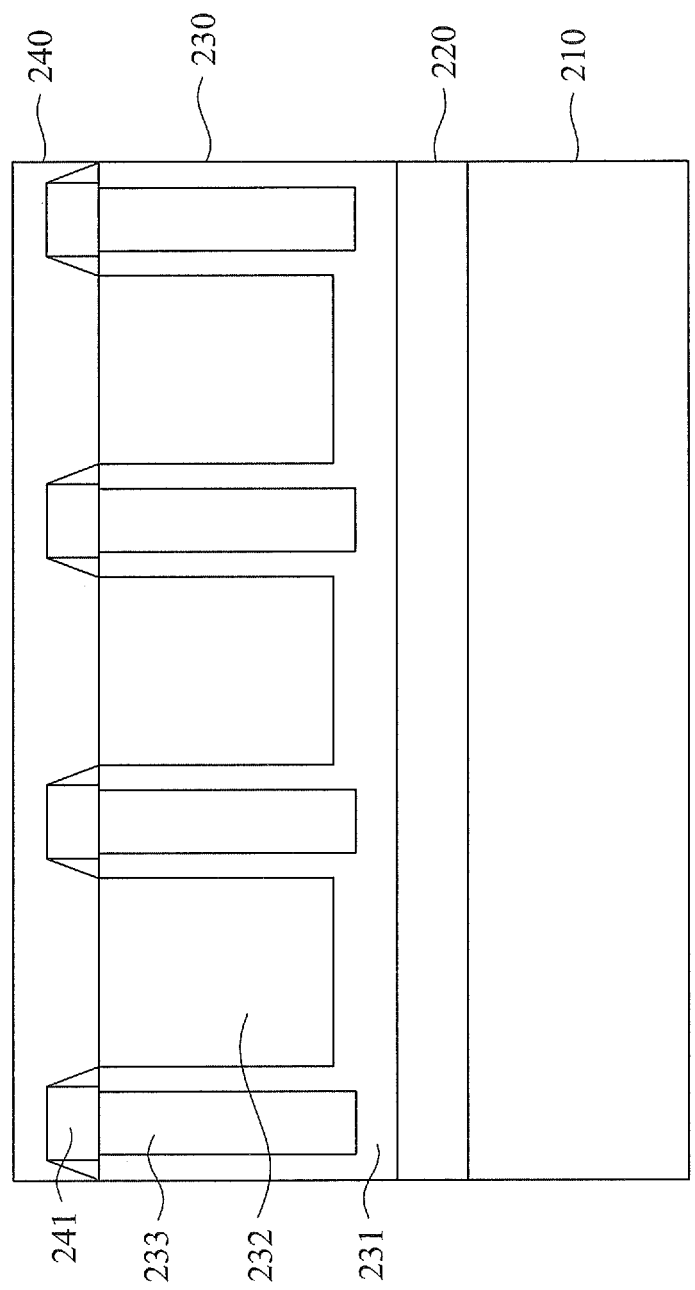
Figure 2F:
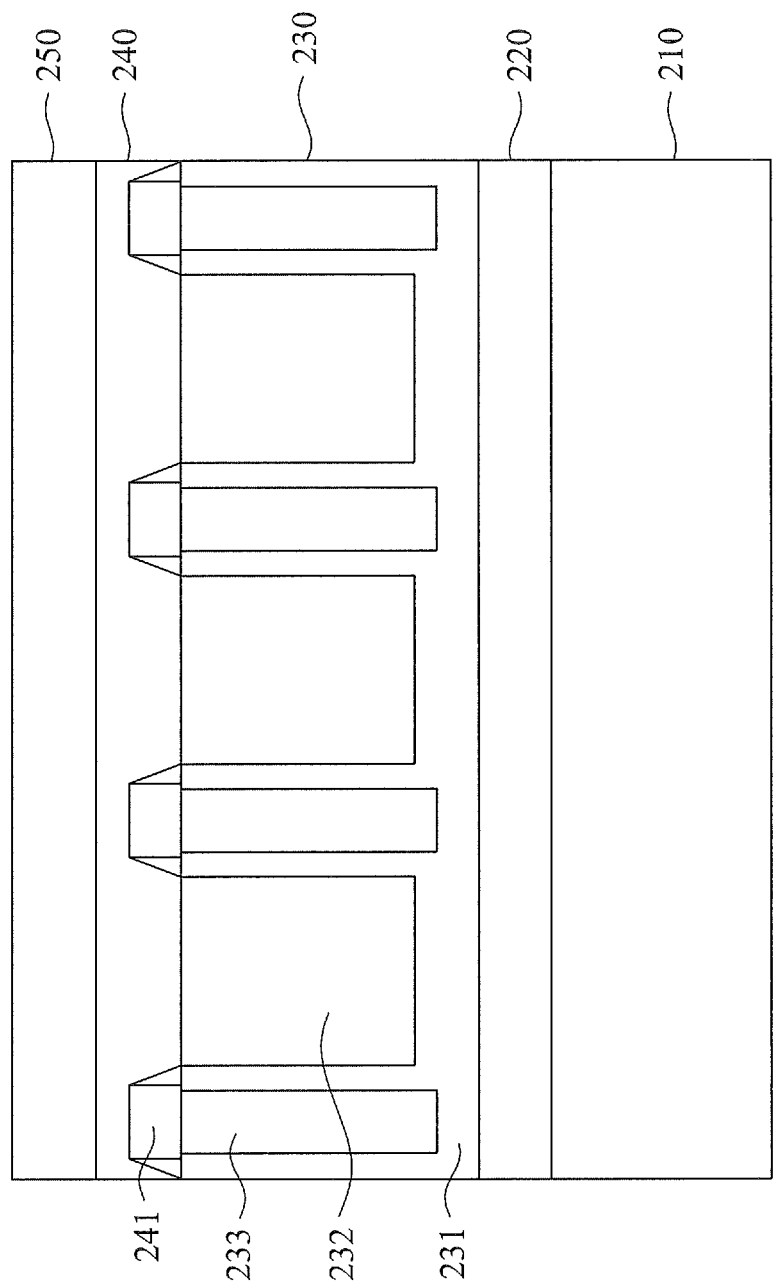
Figure 2G:
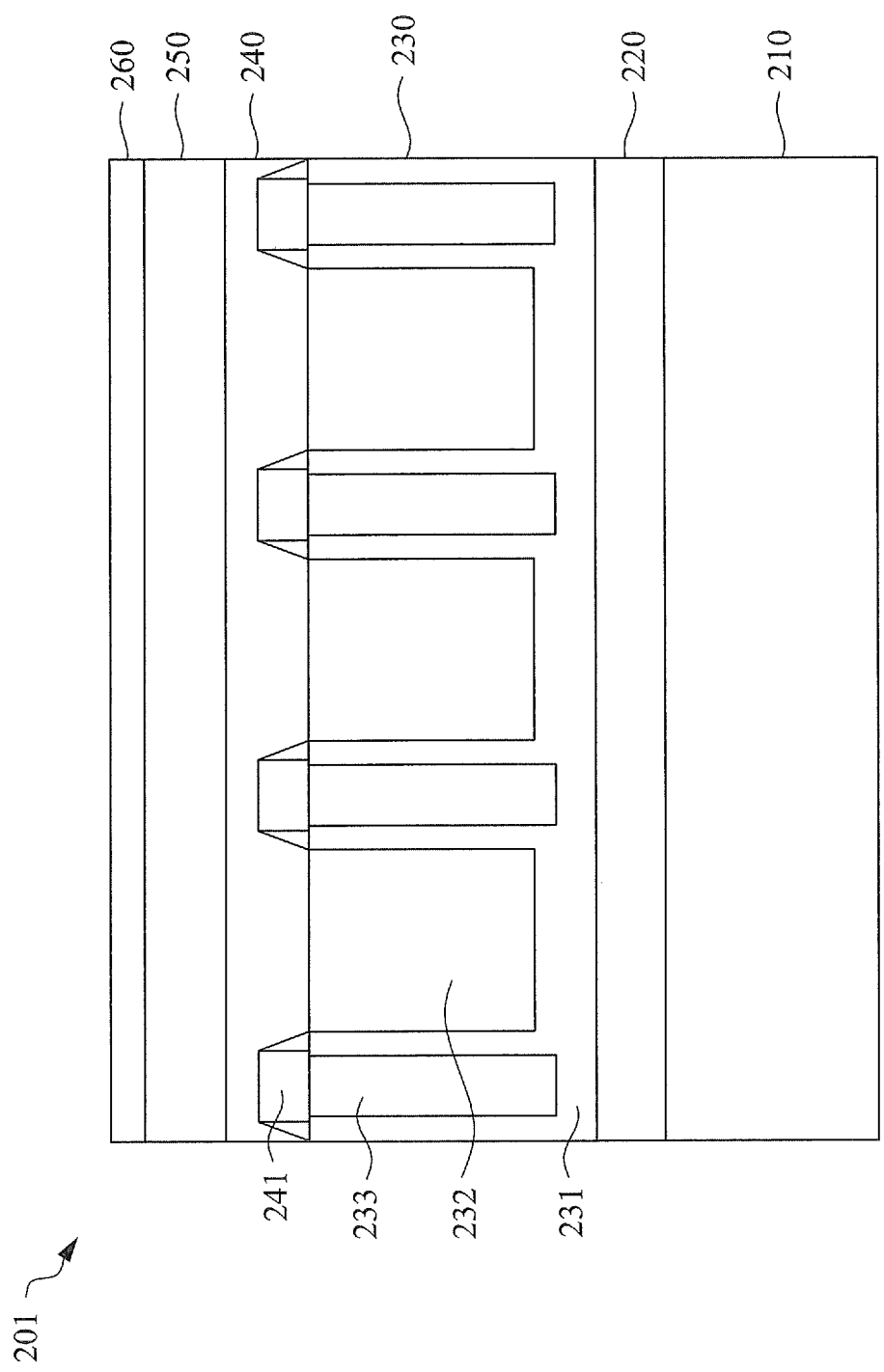
Figure 2H:
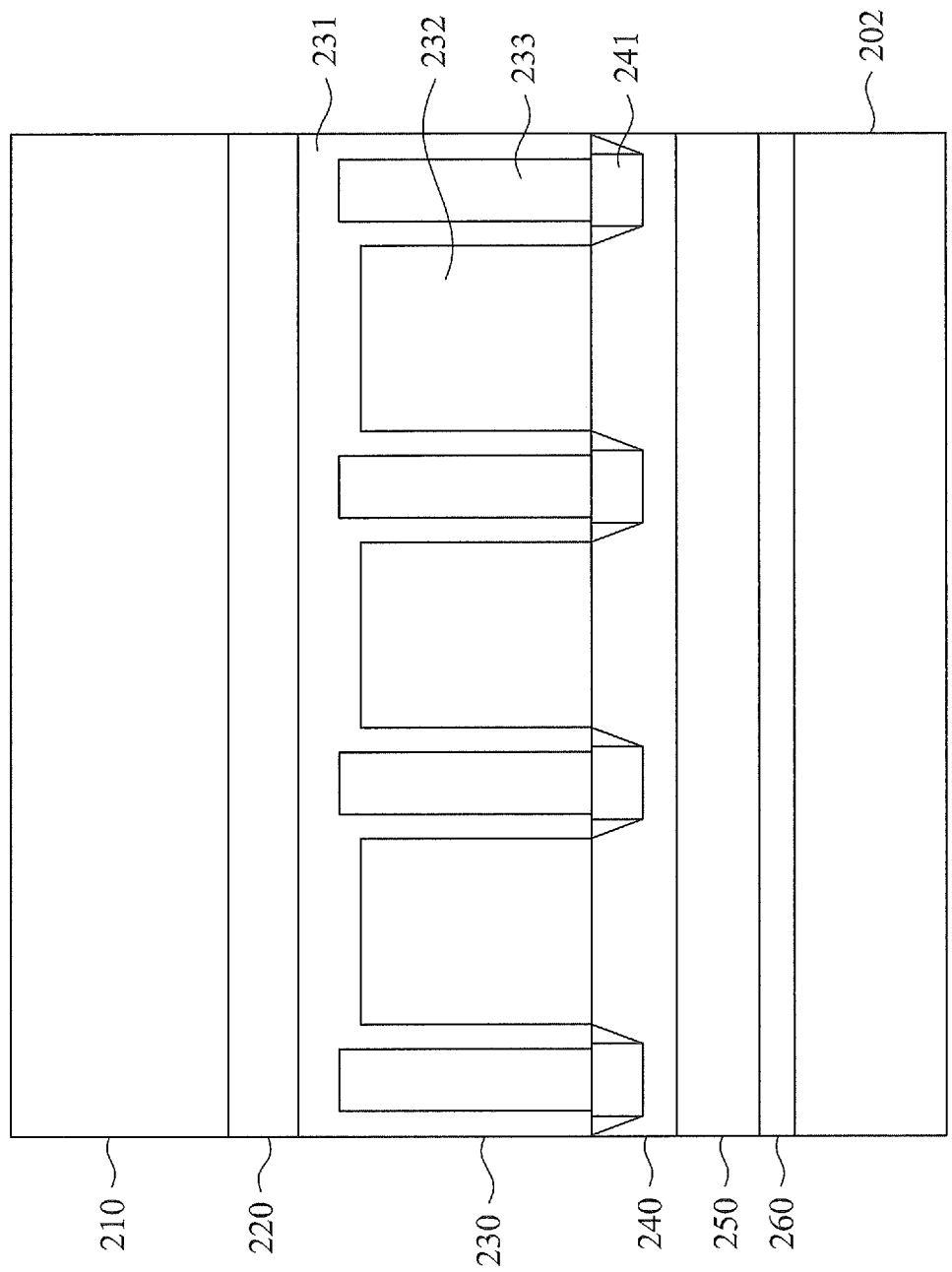
Figure 2I:
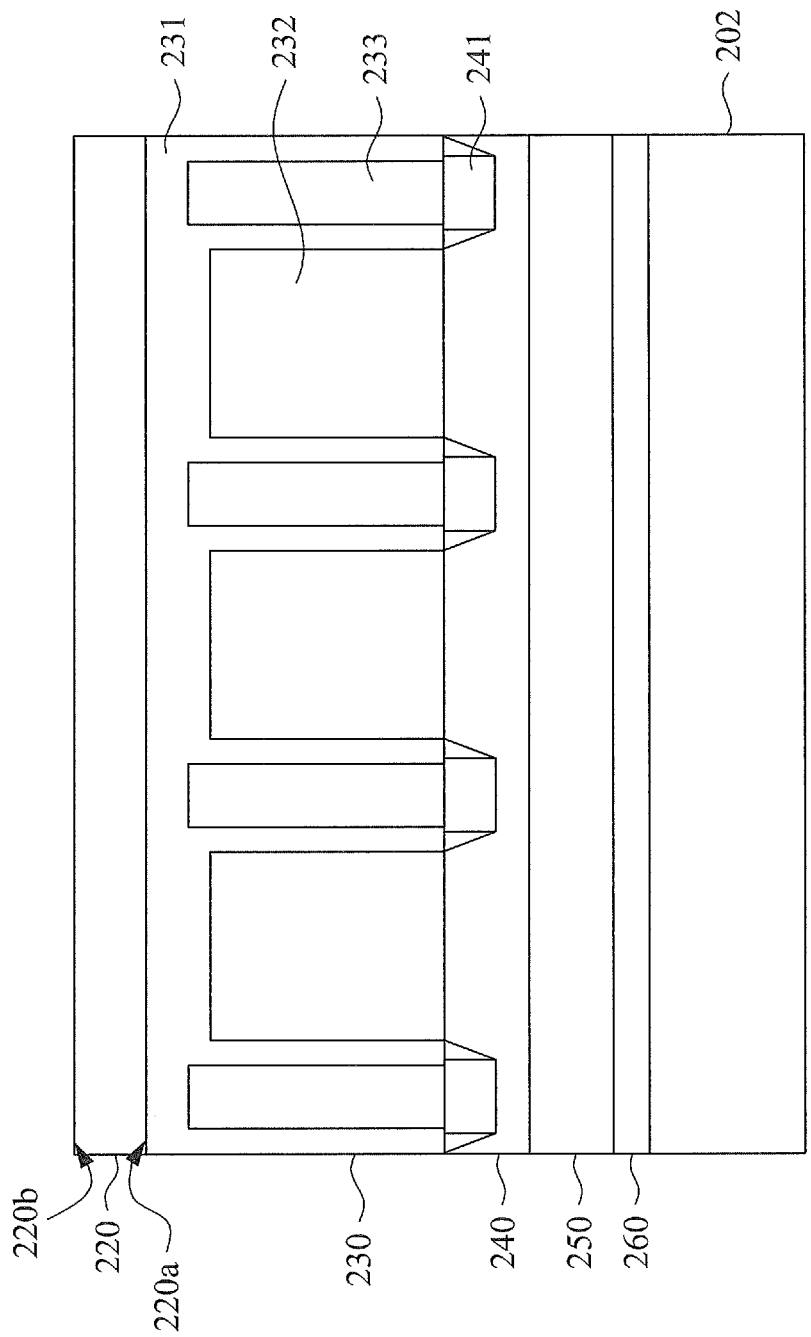
Figure 2J:
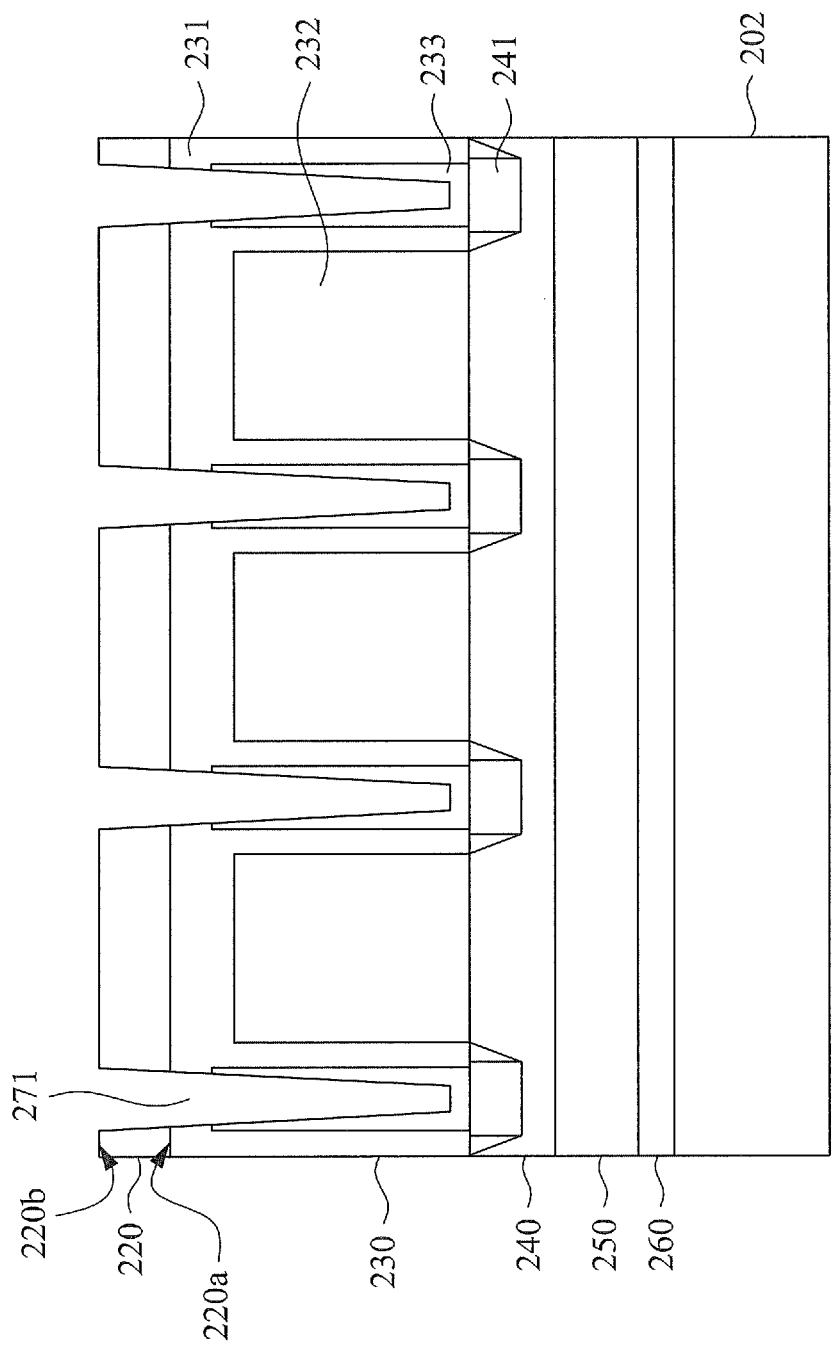
Figure 2K:
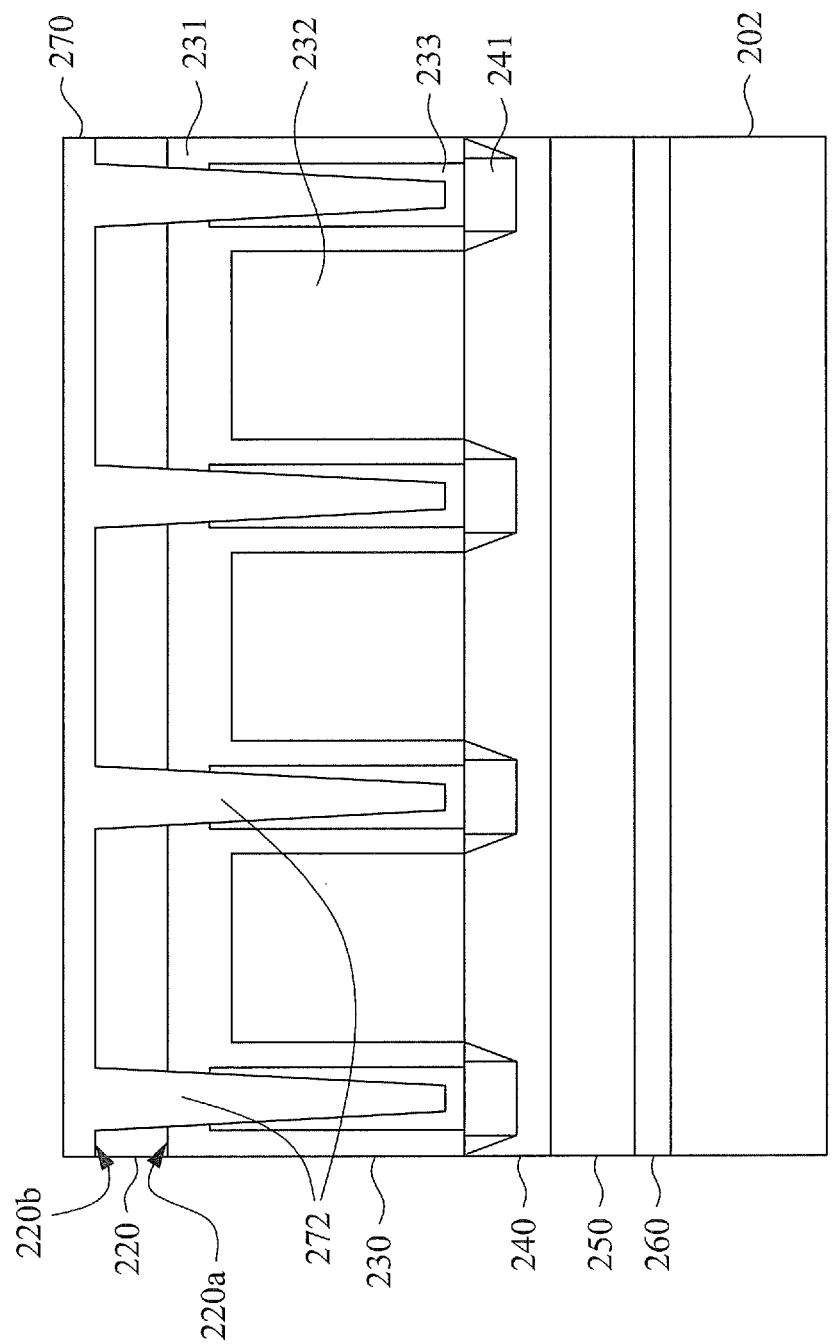
Figure 2L:
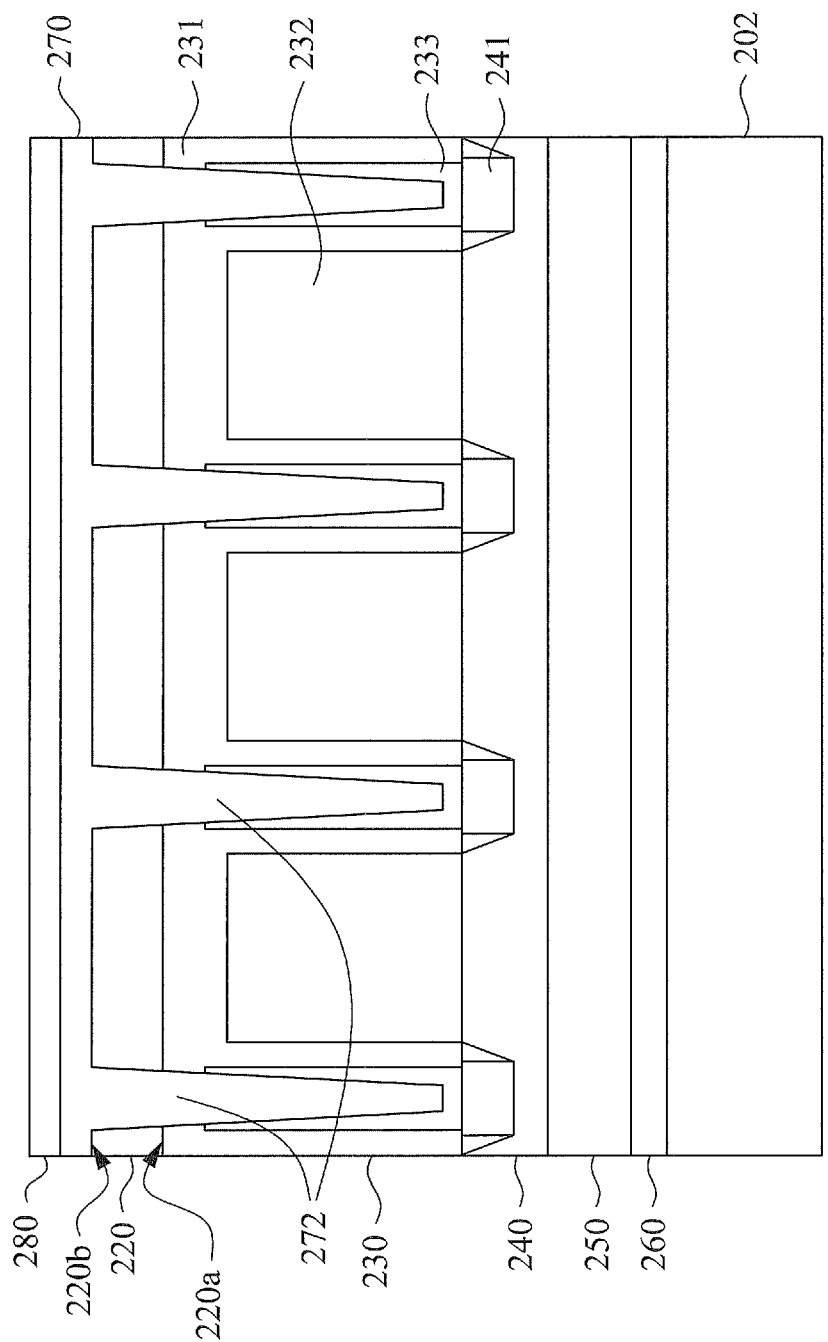
Figure 2M:
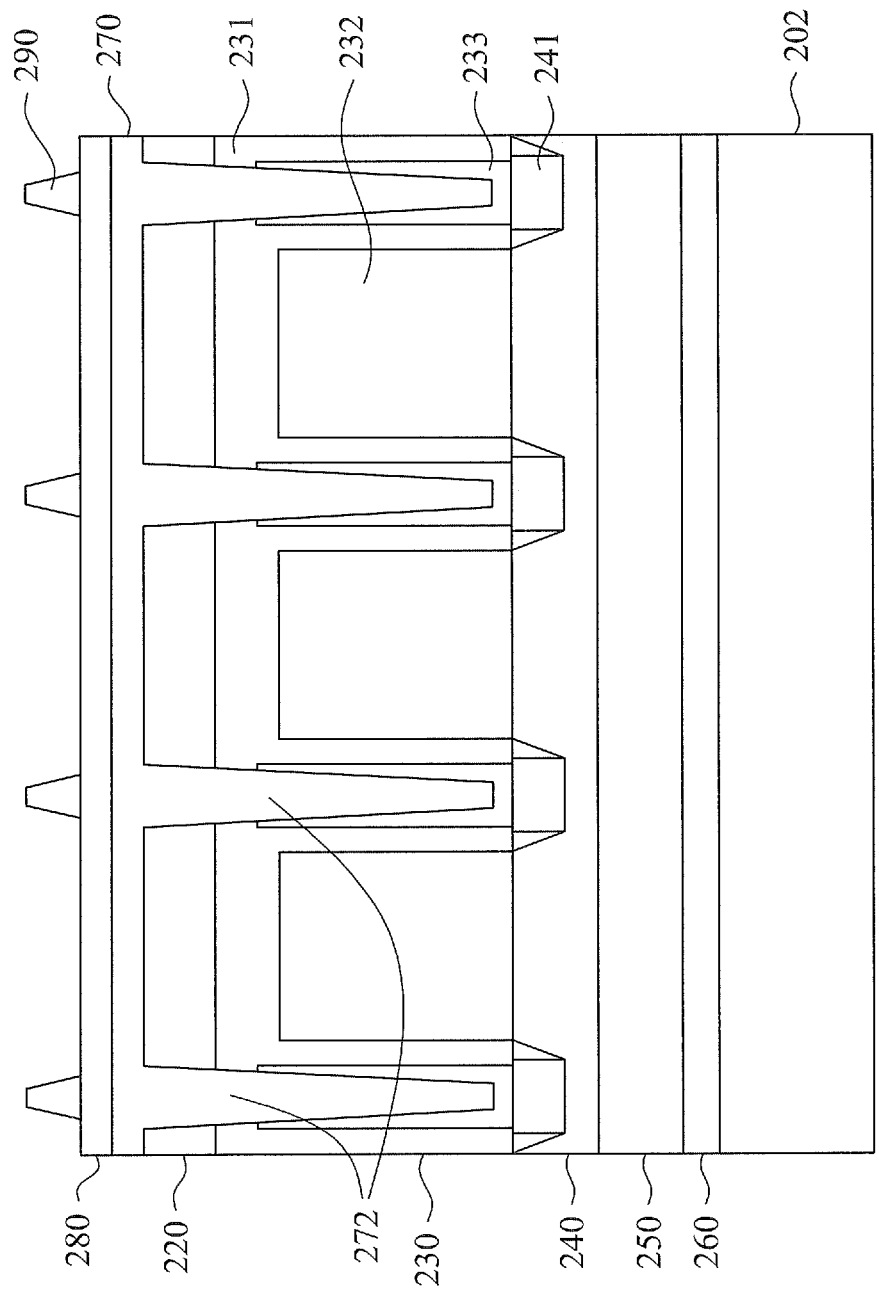
Figure 2N:
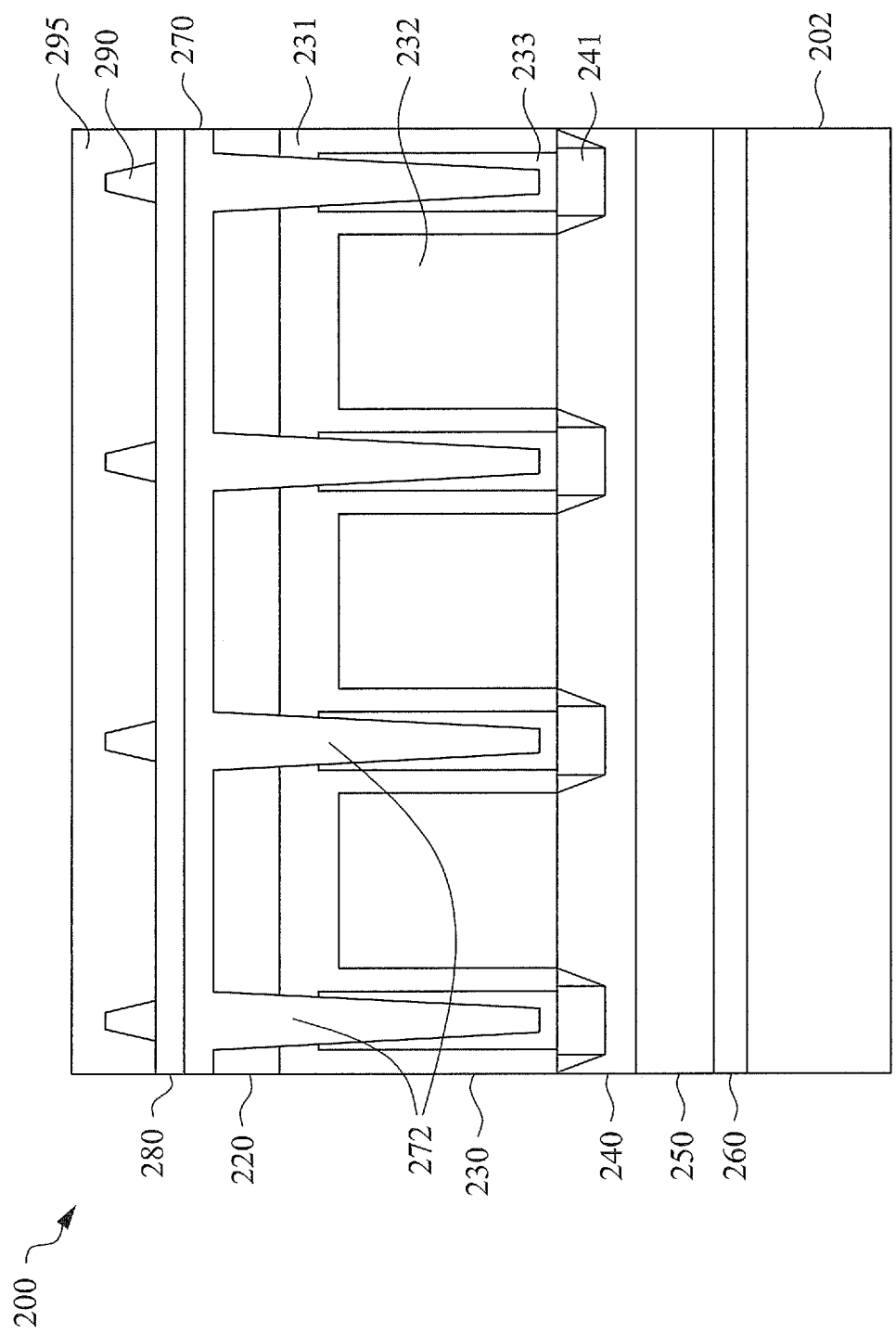

FIG. 2A through FIG. 2N are schematic cross-sectional views of intermediate stages showing a method for manufacturing a semiconductor device, e.g. the semiconductor device 100 in FIG. 1, in accordance with some embodiments of the present disclosure. FIG. 2A is a cross-sectional view of the semiconductor device including a semiconductor substrate 210 and an insulation layer 220, which is formed on the semiconductor substrate 210 at one of the various stages of fabrication, according to some embodiments of the present disclosure. The semiconductor substrate 210 may be provided to include a group IV material, a group IV material compound, or a group III-V material compound. For example, the group IV material may be Si or Ge, the group IV material compound may be SiGe, and the group I-V material compound may be sapphire. The insulation layer 220 may include a dielectric material, such as silicon oxide, silicon nitride, silicon oxynitride, silicon carbide, or any combinations thereof.

FIG. 2B is a cross-sectional view of the semiconductor device including a semiconductor layer 230, which is formed on the insulation layer 220 at one of the various stages of fabrication, according to some embodiments of the present disclosure. The semiconductor layer 230 is formed by epitaxially growing a first semiconductor material 231 on the insulation layer 220, to provide an SOI structure. The first semiconductor material 231 may include a group IV material, a group IV material compound, or a group III-V material compound. For example, the first semiconductor material 231 in FIG. 2B may include silicon.

As shown in FIG. 2C, the semiconductor layer 230 is formed to include various light sensing regions 232. The light sensing regions 232 may be formed by: defining a geometric pattern from a photomask to the semiconductor layer 230 based on photolithography; etching the semiconductor layer 230 to determine a plurality of etched regions in the semiconductor layer 230; epitaxially growing a second semiconductor material in the plurality of etched regions to form a plurality of light sensing regions 232 in the semiconductor layer 230; and performing chemical mechanical polishing (CMP) to smooth the surfaces of the semiconductor layer 230 and the plurality of light sensing regions 232. In one embodiment, the second semiconductor material is different from the first semiconductor material. For example, when the first semiconductor material is silicon, the second semiconductor material is germanium, or another semiconductor material having a band gap smaller than that of silicon, or any semiconductor material compound having a band gap smaller than that of silicon. As such, each of the light sensing regions 232 is surrounded by the first semiconductor material 231.

Each of the light sensing regions 232 may be formed to include a photodiode. In one embodiment, each of the plurality of light sensing regions 232 is doped such that a doping concentration varies from one light sensing region to another based on a predetermined design, e.g. based on different optimal conditions for RGB colors.

As shown in FIG. 2D, the semiconductor layer 230 is further formed to include various isolation regions 233. The isolation regions 233 may be formed by: determining, in the semiconductor layer 230, a plurality of isolation regions 233 each of which is between two adjacent light sensing regions 232; and doping each of the plurality of isolation regions 233 to generate an implanted well in the isolation region. The implanted wells in the isolation regions 233 may provide electric isolations between every two adjacent light sensing regions 232. Each implanted well may have a height or depth larger than that of each light sensing region 232.

Figure 5:
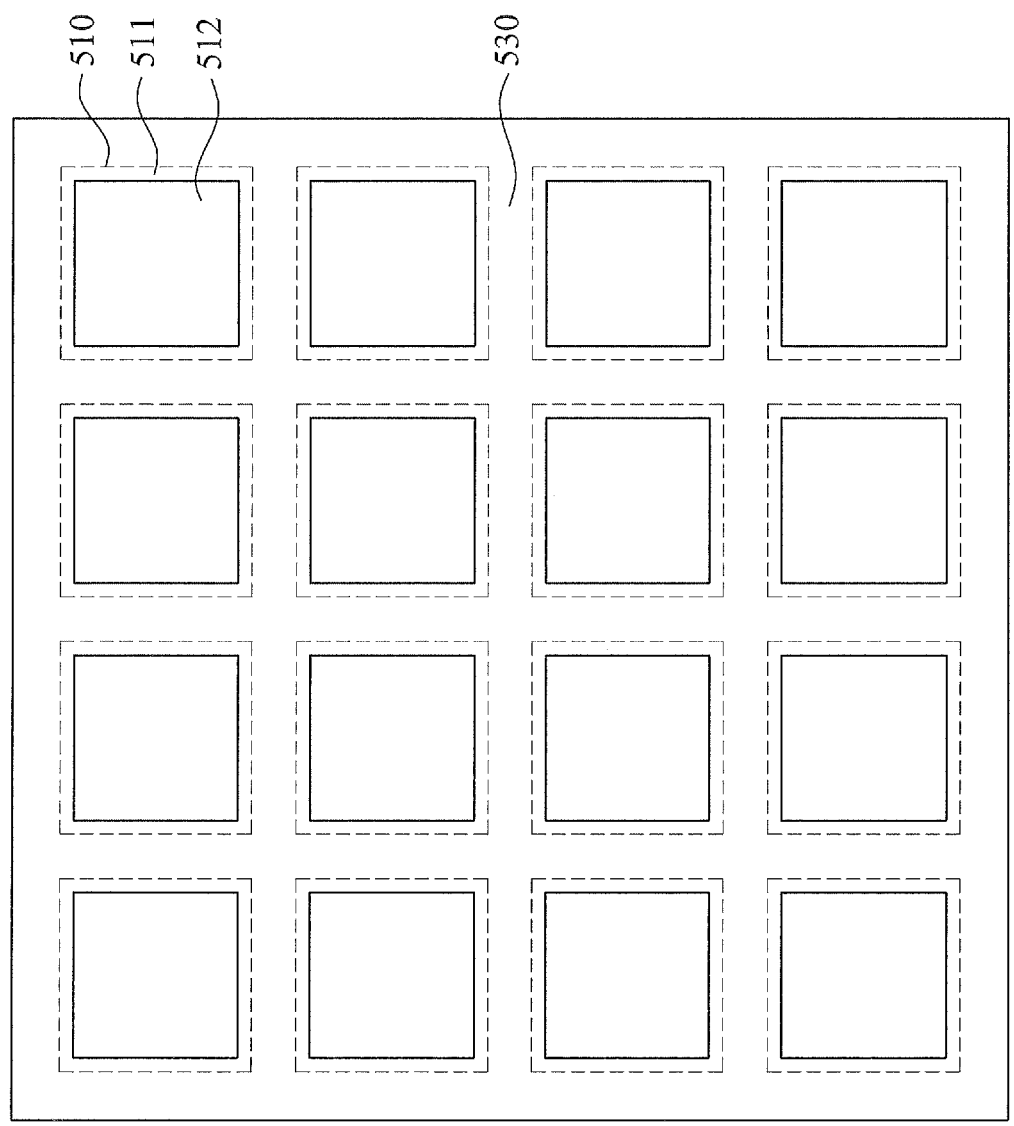
FIG. 5 illustrates a schematic top view of a semiconductor layer and isolation structures of a semiconductor device, in accordance with some embodiments of the present disclosure.

In one embodiment, the isolation regions 233 are connected to each other to form an aggregated isolation region. FIG. 5 illustrates a schematic top view of a semiconductor layer and isolation structures of a semiconductor device 500, in accordance with some embodiments of the present disclosure. In one embodiment, FIG. 5 illustrates a schematic top view of the semiconductor layer 230 in FIG. 2D. As shown in FIG. 5, the semiconductor device 500 has a plurality of light sensing regions 512 arranged periodically in a planar block of a wafer. In one example, each light sensing region 512 includes germanium and is surrounded by silicon 511.

An aggregated isolation region 530 is distributed on the planar block, filling the space between light sensing regions 512. Each light sensing region 512 is included in a corresponding pixel region 510. The pixel regions 510 are defined by the aggregated isolation region 530. Along the longitudinal and latitudinal directions, every two adjacent pixel regions 510 are separated by the aggregated isolation region 530; and every two adjacent light sensing regions 512 are isolated by the aggregated isolation region 530.

Referring back to FIG. 2E, a device layer 240 is formed on the semiconductor layer 230. The device layer 240 is formed to include various devices 241, such as transistors. In the example shown in FIG. 2E, each of the plurality of devices 241 is located on and in contact with one of the plurality of isolation regions 233. That is, each of the plurality of devices 241 is supported by and in contact with the first semiconductor material 231 for good electrical control, without impacting the light absorption of the second semiconductor material in the light sensing regions 232.

As shown in FIG. 2F, at least one inter-metal dielectric layer 250 may be optionally formed on the device layer 240. In one embodiment, the inter-metal dielectric layer 250 may be formed to include conductive lines, in which conductive lines are electrically connected to the devices 241 of the device layer 240. The inter-metal dielectric layer 250 may be formed to include a dielectric film, such as silicon oxide, silicon nitride, silicon oxynitride, silicon carbide, or any combinations thereof.

In some exemplary examples, as shown in FIG. 2G, a passivation layer 260 is optionally formed on the inter-metal dielectric layer 250. The passivation layer 260 may be formed by using a deposition process, such as a chemical vapor deposition (CVD) process. The passivation layer 260 may be formed to include a dielectric film, such as silicon oxide, silicon nitride, silicon oxynitride, silicon carbide, or any combinations thereof. This forms a first wafer or a device wafer 201.

In some exemplary examples, as shown in FIG. 2H, a carrier wafer 202 is provided. The semiconductor substrate 210 and the structure formed thereon, which includes the insulation layer 220, the semiconductor layer 230, the device layer 240, the inter-metal dielectric layer 250, and the passivation layer 260, are flipped as shown in FIG. 2H. That is, the device wafer 201 is flipped over and is bonded to the carrier wafer 202. The passivation layer 260 is suitable for bonding the inter-metal dielectric layer 250 and the carrier 202. After the inter-metal dielectric layer 250 is bonded to the carrier 202 by using the passivation layer 260, the device layer 240 and the semiconductor layer 230 are disposed on the carrier 202.

As shown in FIG. 2I, the semiconductor substrate 210 is removed after the wafer bonding to expose the insulation layer 220. For example, the semiconductor substrate 210 may be removed by using an etching process, a polishing process or a thinning process. The polishing process may be a chemical mechanical polishing (CMP) process. Optionally, a thinning process may be performed on the top surface of the insulation layer 220 to reduce a thickness of the insulation layer 220. For example, the thinning process may be performed by using an etching process or a polishing process. In certain examples, removing the semiconductor substrate 210 and thinning the insulation layer 220 may be performed by one single process. In one embodiment, after the removing and/or thinning process, at least part of the insulation layer 220 is kept on the semiconductor layer 230. The insulation layer 220 may serve as a passivation layer for the semiconductor layer 230. The at least part of the insulation layer 220 has a top surface 220b and a bottom surface 220a that is opposite to the top surface 220b and is in contact with the semiconductor layer 230 after the wafer bonding.

In some examples, as shown in FIG. 2J, after the semiconductor substrate 210 is removed, various trenches 271 may be optionally formed through the insulation layer 220 and into the semiconductor layer 230. For example, the trenches 271 may be formed by removing portions of the insulation layer 220 and the semiconductor layer 230 using a photolithography process and an etching process. The trenches 271 extend from the top surface 220b of the insulation layer 220, through the bottom surface 220a of the insulation layer 220, to a predetermined thickness of the semiconductor layer 230. The trenches 271 may be deep trenches each of which extends into a corresponding one of the plurality of isolation regions 233.

After the trenches 271 are formed, the trenches 271 are respectively filled with various isolation structures 272, as shown in FIG. 2K. Each of the isolation structures 272 isolates two adjacent ones of the light sensing regions 232, to avoid or reduce optical crosstalk. The isolation structures 272 may be formed by using a deposition technique, such as a chemical vapor deposition technique. In certain examples, as shown in FIG. 2K, in forming the isolation structures 272, a dielectric layer 270 is formed on the top surface 220b of the insulation layer 220, in which the trenches 271 are filled with the dielectric layer 270, such that the isolation structures 272 are respectively formed in the trenches 271. The top surface 220b of the insulation layer 220 is covered by the dielectric layer 270. For example, the dielectric layer 270 is formed to include a dielectric material, such as silicon oxide, silicon nitride, silicon oxynitride, silicon carbide, or any combinations thereof.

In some examples, as shown in FIG. 2L, a buffer layer 280 is optionally formed on the dielectric layer 270. In some embodiments, the buffer layer 280 may be formed directly on and in contact with the top surface 220b of the insulation layer 220. In some embodiments, top surface 220b of the insulation layer 220 is covered by the dielectric layer 270, and the buffer layer 280 is formed on the dielectric layer 270. The buffer layer 280 may be formed by using a deposition technique. The buffer layer 280 may be transparent and may be formed to include a dielectric material, such as silicon oxide, silicon nitride, silicon oxynitride, silicon carbide, or any combinations thereof.

In some examples, as shown in FIG. 2M, a metal grid layer 290 is optionally formed on portions of the buffer layer 280. The metal grid layer 290 may be formed by using a deposition technique, a photolithography technique, and an etching technique, in which the deposition technique may be a physical vapor deposition technique or a chemical vapor deposition technique. For example, the metal grid layer 290 may be formed to include W, Ti, TiN, Ta, TaN, Al, Cu, AlCu, Ni, or any combinations or alloys thereof.

In some examples, as shown in FIG. 2N, a passivation layer 295 is optionally formed on and covering the buffer layer 280 and the metal grid layer 290, so as to substantially complete a semiconductor device 200. The passivation layer 295 may be formed to protect the metal grid layer 290 and the buffer layer 280. The passivation layer 295 may be formed to include a dielectric film, such as silicon oxide, silicon nitride, silicon oxynitride, silicon carbide, or any combinations thereof.

Figure 3:
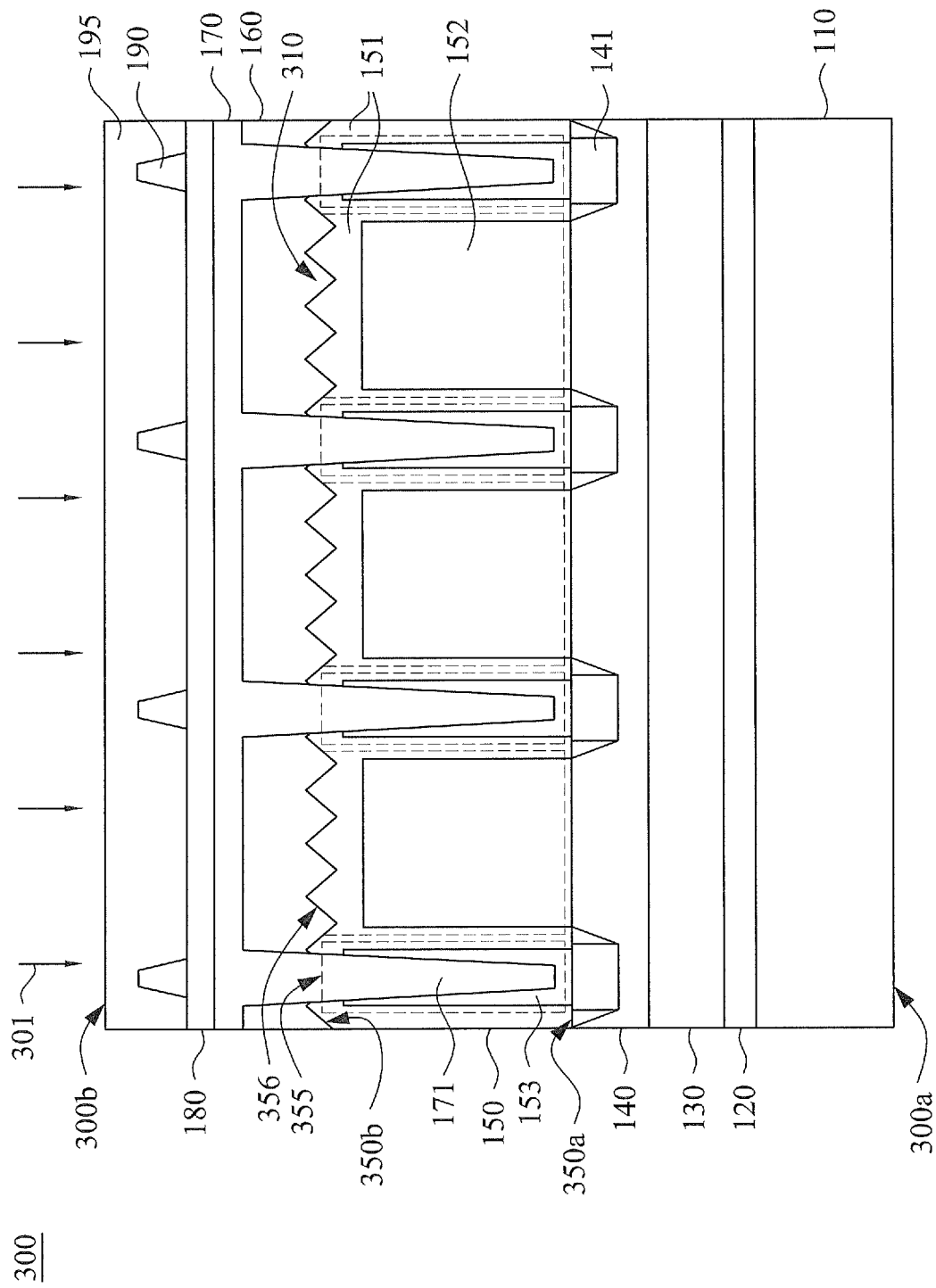
FIG. 3 illustrates a schematic cross-sectional view of another semiconductor device, in accordance with some embodiments of the present disclosure.

FIG. 3 illustrates a schematic cross-sectional view of another semiconductor device 300, in accordance with some embodiments of the present disclosure. In some embodiments, the semiconductor device 300 is a CMOS image sensor device, which may be operated for sensing incident light 301. The semiconductor device 300 has a front side 300a and a back side 300b. In some embodiments, the semiconductor device 300 is a BSI CMOS image sensor device, which is operated to sense the incident light 301. In this embodiment, the incident light 301 is projected from the back side 300b of the semiconductor device 300.

The semiconductor device 300 in FIG. 3 has a structure same as that of the semiconductor device 100 in FIG. 1, except that the semiconductor layer 150 of the semiconductor device 300 in FIG. 3 has a top surface 350b with a patterned and non-flat structure. The top surface 350b is opposite to the bottom surface 350a of the semiconductor layer 150, where the bottom surface 350a is in contact with the device layer 140. In one embodiment, the patterned structure of the top surface 350b increases a quantum efficiency of the image sensor 300 compared to a flat surface structure.

In one embodiment, the patterned and non-flat structure includes various pit portions 310 arranged on the top surface 350b. For example, the pit portions 310 may be pyramid pit portions or prism pit portions. The semiconductor layer 150 in FIG. 3 includes a plurality of isolation regions 355 and a plurality of pixel regions 356 separated by the isolation regions 355. In some examples, in each of the pixel regions 356, the pit portions 310 are regularly arranged on the top surface 350b. Any two adjacent ones of the pit portions 310 may adjoin to each other. In some examples, any two adjacent ones of the pit portions 310 are separated from each other. In some examples, shapes of the pit portions 310 of the semiconductor layer 150 are substantially the same. For different semiconductor layers, pit portions on these semiconductor layers may have different shapes.

Figure 4A:
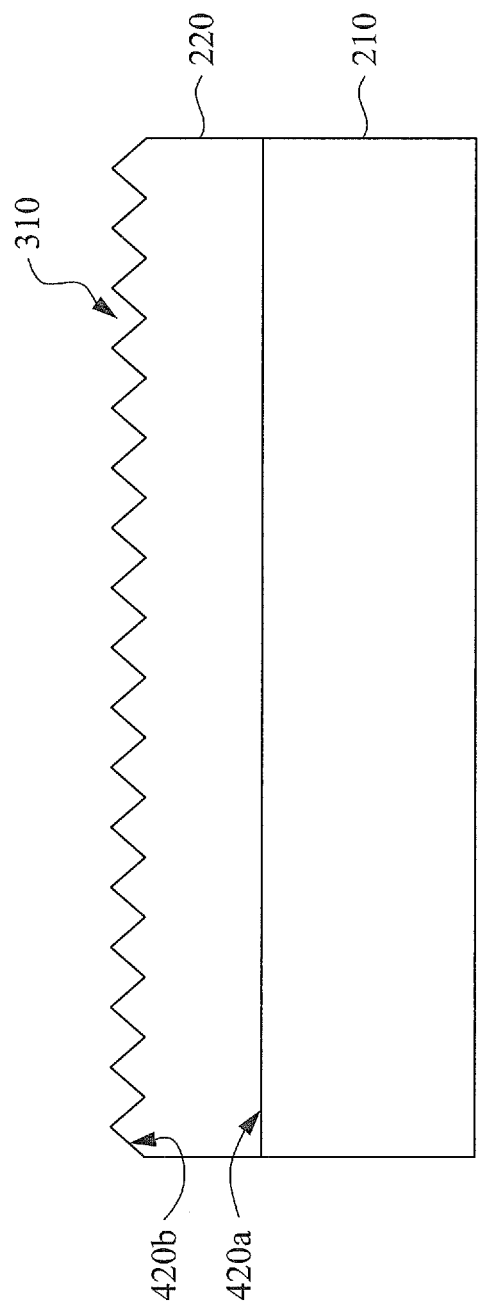
FIG. 4A and FIG. 4B are schematic cross-sectional views of intermediate stages showing part of a method for manufacturing a semiconductor device, in accordance with some embodiments of the present disclosure.
Figure 4B:
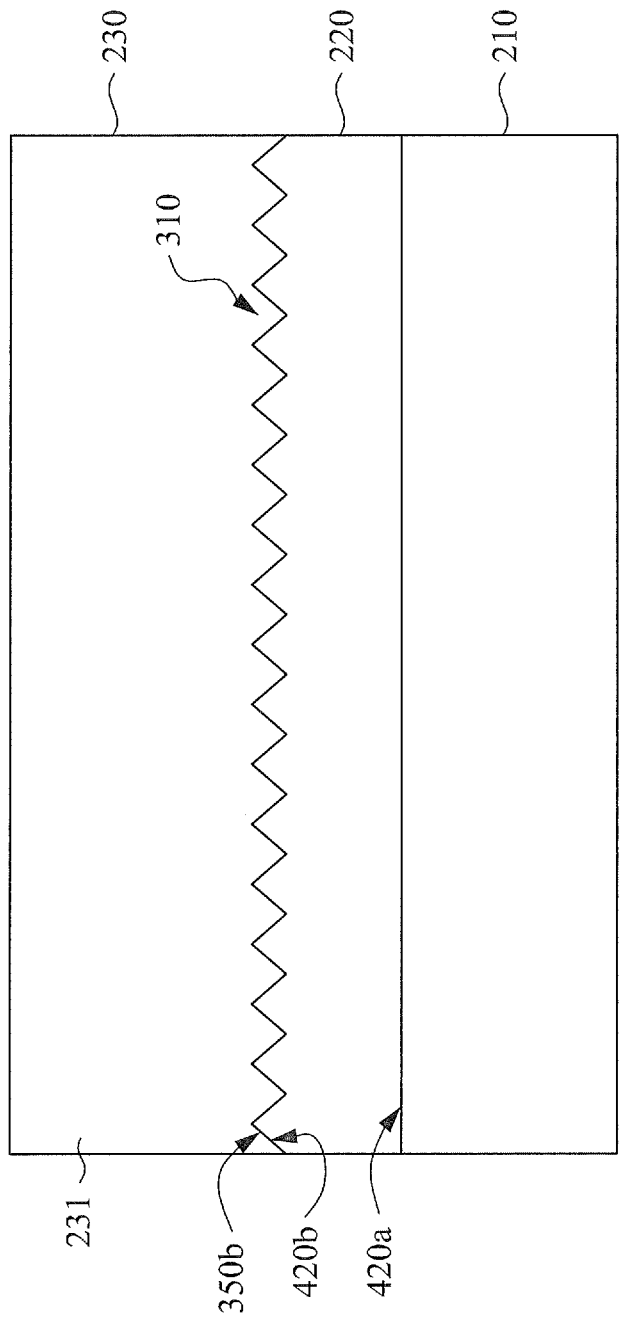

FIG. 4A and FIG. 4B are schematic cross-sectional views of intermediate stages showing part of a method for manufacturing a semiconductor device, e.g. the semiconductor device 300 in FIG. 3, in accordance with some embodiments of the present disclosure. FIG. 4A is a cross-sectional view of the semiconductor device including a semiconductor substrate 210 and an insulation layer 220, which is formed on the semiconductor substrate 210 at one of the various stages of fabrication, according to some embodiments of the present disclosure. The semiconductor substrate 210 may be provided to include a group IV material, a group IV material compound, or a group III-V material compound. For example, the group IV material may be Si or Ge, the group IV material compound may be SiGe, and the group III-V material compound may be sapphire. The insulation layer 220 may include a dielectric material, such as silicon oxide, silicon nitride, silicon oxynitride, silicon carbide, or any combinations thereof. The insulation layer 220 has a first surface 420a in contact with the semiconductor substrate 210 and a second surface 420b opposite to the first surface 420a.

As shown in FIG. 4A, the second surface 420b is formed to have a patterned structure, to increase a quantum efficiency of the image sensor compared to a flat surface structure. In one embodiment, the patterned structure may be formed based on an etching process performed on the second surface 420b of the insulation layer 220 to form various pit portions 310 on the second surface 420b of the insulation layer 220. In some examples, the etching process may be performed based on: a patterned hard mask, a deposition technique, a photolithography technique, and an etching technique, such as a dry etching operation and/or a wet etching operation.

The pit portions 310 may be pyramid pit portions or prism pit portions regularly arranged on the second surface 420b of the insulation layer 220. In some examples, the pit portions 310 may be arranged in an array. Any two adjacent ones of the pit portions 310 may adjoin to each other or may be separated from each other. In addition, shapes of the pit portions 310 may be substantially the same.

FIG. 4B is a cross-sectional view of the semiconductor device including a semiconductor layer 230, which is formed on the insulation layer 220 at one of the various stages of fabrication, according to some embodiments of the present disclosure. The semiconductor layer 230 is formed by depositing or epitaxially growing a first semiconductor material 231 on and in contact with the second surface 420b of the insulation layer 220, to provide a SOI structure. The first semiconductor material 231 may include a group IV material, a group IV material compound, or a group III-V material compound. For example, the first semiconductor material 231 in FIG. 4B may include silicon.

As shown in FIG. 4B, the semiconductor layer 230 has a first surface 350b in contact with the second surface 420b of the insulation layer 220. As such, the first surface 350b of the semiconductor layer 230 has the same patterned structure as the second surface 420b of the insulation layer 220. The remaining stages of the method for manufacturing a semiconductor device, e.g. the semiconductor device 300 in FIG. 3, are similar to the stages shown in FIG. 2C to FIG. 2N, and are omitted here for simplicity. After the wafer bonding, the patterned first surface 350b of the semiconductor layer 230 will become a top surface of the semiconductor layer, like the top surface 350b in the semiconductor device 300 of FIG. 3.

Figure 6:
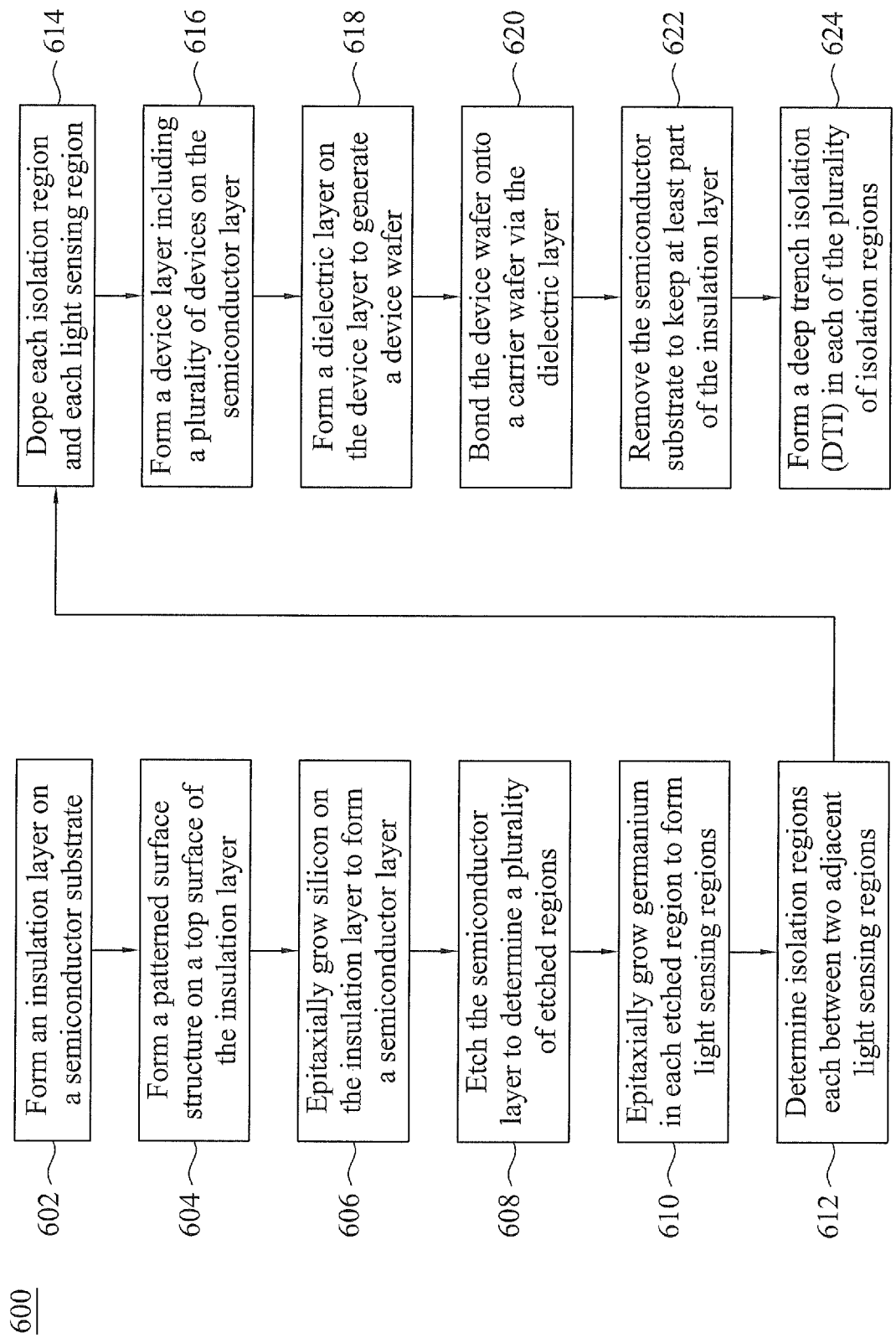
FIG. 6 illustrates a flow chart of a method for manufacturing a semiconductor device, in accordance with some embodiments of the present disclosure.

FIG. 6 illustrates a flow chart of a method 600 for manufacturing a semiconductor device, in accordance with some embodiments of the present disclosure. The method begins at operation 602, where an insulation layer is formed on a semiconductor substrate. Optionally at operation 604, a patterned surface structure is formed on a top surface of the insulation layer. The patterned surface structure may be a periodic and non-flat structure.

At operation 606, silicon is grown epitaxially on the insulation layer to form a semiconductor layer. The semiconductor layer is etched to determine a plurality of etched regions at operation 608. Then at operation 610, germanium or another semiconductor material with a lower band gap than silicon, is grown epitaxially in each etched region to form light sensing regions.

At operation 612, isolation regions are determined, wherein each isolation region is between two adjacent light sensing regions. At operation 614, each isolation region and each light sensing region is doped. In one embodiment, the isolation regions and the light sensing regions are doped with different types of doping materials. For example, when the isolation regions are doped with p-type material, the light sensing regions are doped with n-type material. The doped isolation regions can provide an electrical isolation between every two adjacent light sensing regions. In one embodiment, the isolation regions are connected to each other to form an aggregated isolation region.

At operation 616, a device layer including a plurality of devices is formed on the semiconductor layer. At operation 618, a dielectric layer is formed on the device layer to generate a device wafer. The device wafer is bonded onto a carrier wafer via the dielectric layer at operation 620. The semiconductor substrate is removed at operation 622 to keep at least part of the insulation layer on the semiconductor layer after the wafer bonding. At operation 624, a deep trench isolation (DTI) is formed in each of the plurality of isolation regions to provide an optical isolation between every two adjacent light sensing regions.

In some embodiments, a semiconductor device is disclosed. The semiconductor device includes: a carrier; a device layer on the carrier; a semiconductor layer on the device layer; and an insulation layer on the semiconductor layer. The semiconductor layer comprises a plurality of isolation regions and a plurality of pixel regions. The plurality of isolation regions comprises a first semiconductor material. The plurality of pixel regions comprises a second semiconductor material that is different from the first semiconductor material.

In some embodiments, an image sensor is disclosed. The image sensor includes: a device layer including a plurality of devices; a semiconductor layer on the device layer; and an insulation layer on the semiconductor layer. The semiconductor layer comprises a silicon region and at least one light sensing region surrounded by the silicon region. The at least one light sensing region is made of a semiconductor material with a band gap smaller than that of silicon.

In some embodiments, a method for forming an image sensor is disclosed. The method includes: forming an insulation layer on a semiconductor substrate; epitaxially growing a first semiconductor material on the insulation layer to form a semiconductor layer; etching the semiconductor layer to determine a plurality of etched regions in the semiconductor layer; epitaxially growing a second semiconductor material in the plurality of etched regions to form a plurality of light sensing regions in the semiconductor layer, wherein the second semiconductor material is different from the first semiconductor material; forming a dielectric layer over the semiconductor layer to generate a first wafer; and bonding the first wafer onto a second wafer via the dielectric layer.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according to embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A semiconductor device, comprising:
   a device layer having a plurality of devices formed therein;
   a semiconductor layer on the device layer, wherein:
   the semiconductor layer comprises a plurality of isolation regions and a plurality of pixel regions,
   each of the plurality of isolation regions comprises a trench isolation and an implanted well surrounding the trench isolation,
   the trench isolation comprises a dielectric material,
   the implanted well comprises a first semiconductor material, and
   the plurality of pixel regions comprises a second semiconductor material that is different from the first semiconductor material; and
   an insulation layer on the semiconductor layer,
   wherein the insulation layer comprises silicon oxide to serve as a passivation layer for the semiconductor layer, and
   wherein the plurality of devices are located entirely below a respective one of the plurality of isolation regions and positioned entirely outside the plurality of pixel regions.

2. The semiconductor device of claim 1, wherein the second semiconductor material has a band gap smaller than that of the first semiconductor material.

3. The semiconductor device of claim 1, wherein:
   the plurality of pixel regions are evenly distributed in the semiconductor layer based on a predetermined design; and
   each of the plurality of isolation regions is located between two adjacent pixel regions.

4. The semiconductor device of claim 1, wherein the semiconductor layer comprises a light sensing sublayer including a plurality of light sensing regions, wherein each of the plurality of pixel regions comprises a corresponding one of the plurality of light sensing regions.

5. The semiconductor device of claim 4, wherein:
   each of the plurality of light sensing regions comprises the second semiconductor material and a doping material; and
   doping concentrations of the plurality of light sensing regions are different from each other based on a predetermined design.

6. The semiconductor device of claim 4, wherein:
   the semiconductor layer has a first thickness between 2 micrometers and 10 micrometers; and
   each of the plurality of light sensing regions in the light sensing sublayer has a second thickness that is equal to or smaller than the first thickness.

7. The semiconductor device of claim 1, wherein:
   the trench isolation is one of: a shallow trench isolation, or a deep trench isolation.

8. The semiconductor device of claim 1, wherein:
   the semiconductor layer has a first surface and a second surface opposite to the first surface that is adjacent to the device layer; and
   the second surface has a non-flat and periodic surface structure.

9. An image sensor, comprising:
   a device layer comprising a plurality of devices;
   a semiconductor layer on the device layer, wherein the semiconductor layer comprises a silicon region and a plurality of light sensing regions surrounded by the silicon region, wherein
   each of the plurality of light sensing regions comprises a same semiconductor material and a same doping material,
   doping concentrations of the plurality of light sensing regions are different from each other based on a predetermined design, and
   wherein the plurality of devices are located below the silicon region without contacting the same semiconductor material in the plurality of light sensing regions; and
   an insulation layer on the semiconductor layer.

10. The image sensor of claim 9, wherein the same semiconductor material is germanium.

11. The image sensor of claim 9, wherein the plurality of devices comprises a plurality of transistors.

12. The image sensor of claim 9, wherein the plurality of devices comprises a plurality of logic devices.

13. The image sensor of claim 9, wherein:
    the silicon region is thicker than the plurality of light sensing regions.

14. A method for forming an image sensor, comprising:
    forming an insulation layer on a semiconductor substrate;
    forming a patterned structure on a first surface of the insulation layer;
    epitaxially growing a first semiconductor material on the insulation layer to form a semiconductor layer on and in contact with the first surface of the insulation layer;
    etching the semiconductor layer to determine a plurality of etched regions in the semiconductor layer;
    epitaxially growing a second semiconductor material in the plurality of etched regions to form a plurality of light sensing regions in the semiconductor layer, wherein the second semiconductor material is different from the first semiconductor material; and
    forming a dielectric layer over the semiconductor layer.

15. The method of claim 14, wherein the patterned structure of the first surface increases a quantum efficiency of the image sensor compared to a flat surface structure.

16. The method of claim 14, further comprising:
    doping each of the plurality of light sensing regions such that a doping concentration varies from one light sensing region to another based on a predetermined design.

17. The method of claim 14, further comprising:
    determining, in the semiconductor layer, a plurality of isolation regions each of which is between two adjacent light sensing regions; and
    doping each of the plurality of isolation regions to generate an implanted well in the isolation region.

18. The method of claim 17, further comprising forming a device layer including a plurality of devices on the semiconductor layer, wherein:
- the dielectric layer is formed on the device layer; and
- each of the plurality of devices is located on one of the plurality of isolation regions.

19. The method of claim 18, further comprising removing the semiconductor substrate on the insulation layer, wherein at least part of the insulation layer is kept to serve as a passivation layer for the semiconductor layer.

20. The method of claim 19, further comprising:
- forming a deep trench in each of the plurality of isolation regions, wherein
  - the at least part of the insulation layer has a top surface and a bottom surface that is opposite to the top surface and is in contact with the semiconductor layer, and
  - the deep trench extends from the top surface of the insulation layer into a corresponding one of the plurality of isolation regions; and
- forming an isolation structure in the deep trench in each of the plurality of isolation regions.

\* \* \* \* \*